United States Patent
Chan

(10) Patent No.: US 7,447,925 B2
(45) Date of Patent: *Nov. 4, 2008

(54) METHOD OF STATE MAINTENANCE FOR FLASH STORAGE CARD IN COMMUNICATION PROTOCOL

(75) Inventor: Chien-Chu Chan, Taichung (TW)

(73) Assignee: Solid State System Co. Ltd., Hsinchu (TW)

( * ) Notice: Subject to any disclaimer, the term of this patent is extended or adjusted under 35 U.S.C. 154(b) by 390 days.

This patent is subject to a terminal disclaimer.

(21) Appl. No.: 11/306,702

(22) Filed: Jan. 9, 2006

(65) Prior Publication Data

US 2006/0200687 A1     Sep. 7, 2006

Related U.S. Application Data

(63) Continuation-in-part of application No. 10/604,765, filed on Aug. 14, 2003, now Pat. No. 7,051,217.

(51) Int. Cl.
G06F 1/00     (2006.01)
G06F 1/26     (2006.01)

(52) U.S. Cl. .................. 713/300; 713/320; 713/340

(58) Field of Classification Search .................. 713/300
See application file for complete search history.

(56) References Cited

U.S. PATENT DOCUMENTS 7,213,120 B2 *   5/2007   Hotaka ................. 711/163
2006/0047860 A1 *   3/2006   Lin ..................... 710/11

FOREIGN PATENT DOCUMENTS

JP     01031290 A   *   2/1989

\* cited by examiner

*Primary Examiner*—Tse Chen
*Assistant Examiner*—Stefan Stoynov
(74) *Attorney, Agent, or Firm*—Jianq Chyun IP Office

(57) ABSTRACT

A method of state maintenance for a flash storage card system. The method includes using a plurality of signals, including a working voltage signal, a low voltage detection (LVD) signal, an LVD interrupt signal, a firmware polling signal, an LVD interrupt reset signal. The LVD signal responds to a voltage level of the working voltage at a preset voltage level. The LVD interrupt signal responds to the level of the LVD signal. After the LVD signal returns to the high level state and the firmware polling signal does the polling action to the LVD interrupt signal, then the LVD interrupt reset signal is issued to reset the LVD interrupt signal.

14 Claims, 3 Drawing Sheets

METHOD OF STATE MAINTENANCE FOR FLASH STORAGE CARD IN COMMUNICATION PROTOCOL

CROSS-REFERENCE TO RELATED APPLICATION

This application is a continuation in part of a prior application U.S. Ser. No. 10/604,765, filed on Aug. 14, 2003, now allowed as U. S. Pat. No. 7,051,217. All disclosures are incorporated herewith by reference.

BACKGROUND OF THE INVENTION

1. Field of Invention

The present invention relates to a control of flash storage card. More particularly, the present invention relates to a method of state maintenance for flash storage card in control.

2. Description of Related Art

A flash storage card, such as the MultiMediaCard (MMC)/Secure Digital Card (SD) is a universal low cost data storage and communication media. It is designed to cover a wide area of applications as electronic toys, organizers, PDAs, cameras, smart phones, digital recorders. MP3 players, pagers, etc. Targeted features are high mobility and high performance at a low cost price. It might also be expressed in terms of low power consumption and high data throughput at the memory card interface. The MMC communication is based on an advanced 7-pin serial bus designed to operate in a low voltage range. The communication protocol is defined as a part of this standard and referred to as MMC mode.

The MMC/SD now is more and more popular in the market. Since the MMC Card's MMC mode can accept multiple cards for transferring and receiving data, the communication protocol should manage multiple cards using several commands for different situations. FIG. 1 is a block diagram, schematically illustrating the MMC Card MMC Mode state diagram in data transfer mode.

In FIG. 1, the operation is basically at the interrupt mode or the data transfer mode. The commands are denoted in the square block starting with CMD. The commands CMD's have been defined in the MMC standard. However, in order to transfer data, there several states 100-110 indicated by the elliptic blocks. Usually, it has the stand-by state 102, transfer state 104, sending-data state 106, receive-data state 108, programming state 110, and disconnect state 112. For the specific state, only some commands can be used, so as to allow the data to be transferred and correctly received between the host and the selected one of the multiple cards.

For example, CMD7 is used to select one card and put it into the transfer state 104. Only one card can be in the transfer state at a given time. If a previously selected card is in the transfer state 104, its connection with the host is released and it will move back to the stand-by state 102. When the command CMD7 is issued with the reserved relative card address "0x0000", all cards are put back to stand-by state. This may be used before identifying new cards without resetting other already registered cards. Cards, which already have a relative card address (RCA), do not respond to identification commands (CMD1, CMD2, CMD3) in this state.

All data communication in the data transfer mode is point-to point between the host and the selected card (using addressed commands). All addressed commands get acknowledged by a response on the CMD line.

According to MMC/SD spec, the memory working voltage is at the range of 2.7 V-3.6 V or 1.65V-1.95V. However, the working voltage may have fluctuation and drops less than a certain level. However, the host may do not know that the working voltage has dropped down a level, at which the data cannot be properly transmitted in flash storage Card, and still keep the transmission state. For this conventional situation, operation of the system may cause a hand up.

FIG. 2 is a timing diagram, schematically illustration the occurrence of hand up situation in the conventional operation for transmitting data. In FIG. 2, when the host intends to write data to MMC/SD, the host state 206 goes through a series of states including idle state (xIDLE), ready state (xReady), identification state (xIDENT), stand-by state (xSTBY), transfer state (xTRAN), and receiving data state (xRCV). During the transfer state, the command CMD25 is issued to write multiple block data. Then, data 210 is transmitted.

However, the working voltage VCC 200 may have fluctuation, for example, occurring at the receiving state (xRCV). When the working voltage is less than a preset voltage level, such as 2.55 V. The low voltage detection (LVD) 202 signal, corresponding to the preset voltage level, drops to a low level in response to the VCC 200. When the working voltage level rises again over the preset voltage level, the LVD signal goes to the high level again. When the LVD goes to the low level, a firmware reset signal 204 at high level is issued, so as to stop the write operation to the flash memory. When the working voltage returns back to the acceptable voltage range, the firmware reset signal 204 returns to the low level and resets the firmware to the initial status.

However, since the host does not known that the firmware has been reset, the status for the data 210 remains at the busy status. If the host doesn't issue a command CMD12, the MMC/SD cannot receive more data and the host cannot pull up the busy signal since the firmware reset 204 doesn't set next SRAM bank for data transfer. The card always remains in the xRCV state. Usually, when the host does not receive data for a period of timeout, a command CMD12 is issued to change to the programming state PRG. However, the card still cannot go back to the xTRAN state since the firmware has been reseted and ignores the CMD12. The firmware will not set PRG_OPERATION_OK. The busy signal still cannot be pulled up. The card stays at the PRG state and is always busy.

Therefore, in the conventional operation based on MMC spec, voltage fluctuation may cause a hand up for the system.

SUMMARY OF THE INVENTION

The invention provides a method for controlling the data transfer mode for the flash storage card, so as to avoid a hand-up situation due to working voltage fluctuation.

The present invention does not use the conventional firmware reset signal to reset the firmware when a voltage fluctuation occurs. Instead, the invention uses an LVDint interrupt signal to replace the LVD, when a voltage fluctuation occurs. The firmware polling signal is used to poll the LVDint interrupt signal. When the LVDint is polled to be the low level and LVD signal is also at high level, a LVDint_Rst signal is issued to reset a register, so as to change the high level of the LVD interrupt signal to the low level. As a result, the LVD interrupt signal is reset, and the firmware is not reset. The host can continuously transfer data without hand-up.

The present invention provides a method of state maintenance for a flash storage system. The method uses a plurality of signals, including a working voltage signal, a low voltage detection (LVD) signal, an LVD interrupt signal, a firmware polling signal, an LVD interrupt reset signal. The LVD signal responds to a voltage level of the working voltage at a preset voltage level. The LVD interrupt signal responds to the level of the LVD signal. When the LVD interrupt signal returns back or is reset to the low level state, the data can be continuously transmitted.

However, since the controlling protocol of the flash storage card does not allow the LVD interrupt signal to be freely reset, the reset of the LVD interrupt signal is activated by using the firmware polling signal. When the LVD interrupt signal issues a high level state, then the firmware polling signal starts to poll the state of the LVD interrupt signal. After the LVD signal returns to the high level state, which means the voltage fluctuation has currently disappeared, and the firmware polling signal does the polling action to the LVD interrupt signal, then the LVD interrupt reset signal is issued to reset the LVD interrupt signal.

As a result, the control protocol is still satisfying the requirement in MMC protocol, and the conventional firmware reset is never done. The situation of hand up is then avoided.

The present invention further provides a flash storage card controlling protocol, such as MultiMediaCard (MMC)/Secure Digital (SD) controlling protocol, suitable for use together with a MMC or SD protocol, wherein a low voltage detection (LVD) signal is used to respond a voltage state of a working voltage with respect to a preset voltage level. The flash storage card controlling protocol comprises an LVD interrupt signal, which changes from a first state to a second state when the LVD signal has changed from a normal state to a low-voltage state. A firmware polling signal, to poll the LVD interrupt signal when the LVD interrupt signal has changed from the first state to the second state. An LVD interrupt reset signal, which is issued after the LVD signal has changed from the low-voltage state back to the normal state and the LVD interrupt signal is indeed polled by the firmware polling signal. The LVD interrupt reset signal resets the LVD interrupt signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the conventional control protocol, the firmware is reset when a voltage drop occurs down to a preset voltage level, which is the working voltage level for the flash storage card, such as the MMC/SD, in data operation. Since the firmware has been reseted after the working voltage returns back to the acceptable range, the hand-up situation occurs. The invention introduces an alternative method to avoid the hand-up situation. The invention uses an LVDint interrupt signal to response the LVD, when a voltage fluctuation occurs. The firmware polling signal is used to poll the LVDint interrupt signal. When the LVDint is polled to be the low level, a LVDint_Rst signal is issued to reset a register, so as to change the high level of the LVD interrupt signal to the low level. As a result, the LVD interrupt signal is reset, and the firmware is not reset. The host can continuously transfer data without hand-up. An embodiment is provided to describe the features of the invention. However, the invention is not limited to the embodiment.

Figure 3:
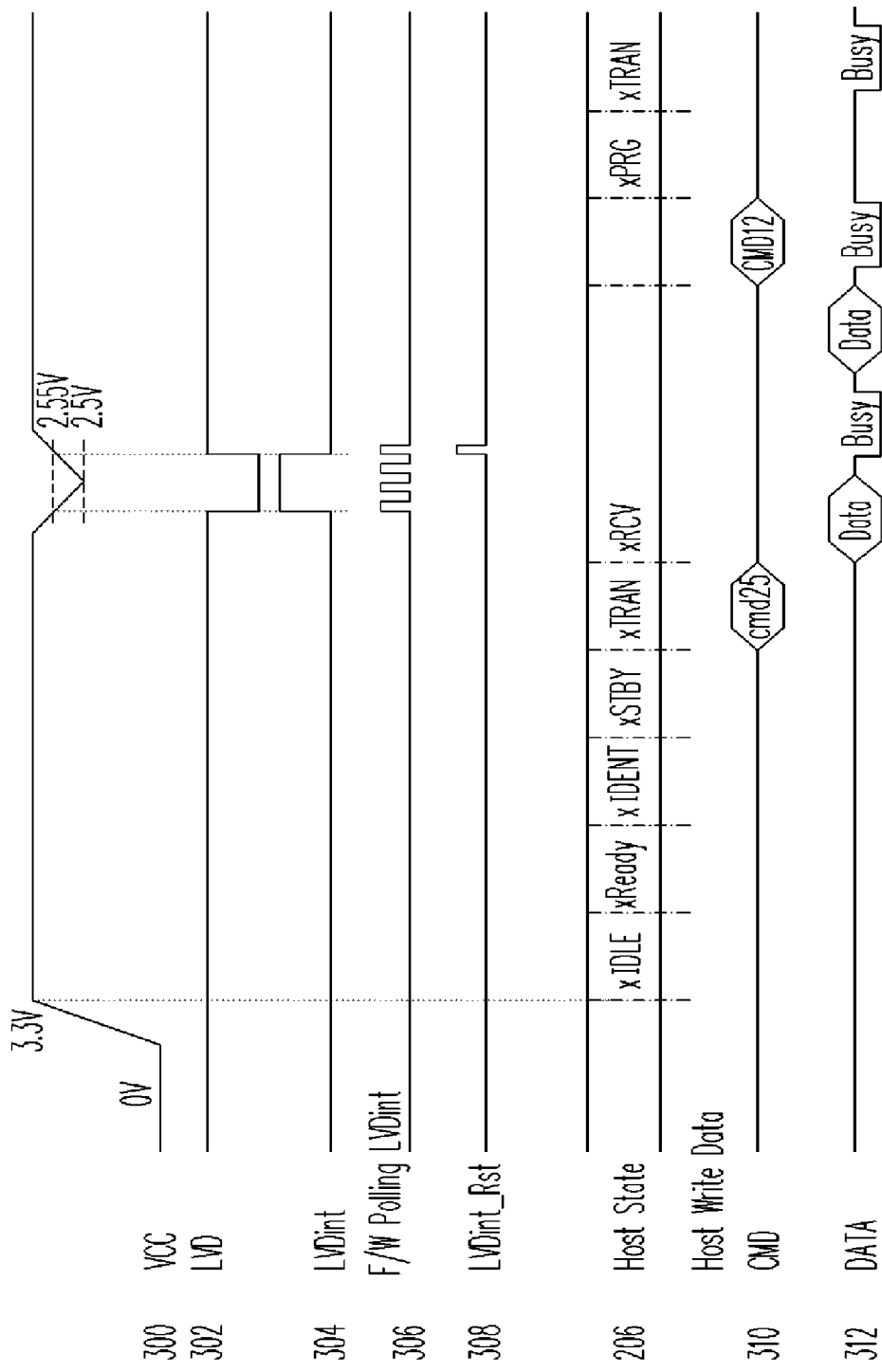
FIG. 3 is a time diagram, schematically illustration the control on the transmitting data to avoid the hand-up situation, according to one preferred embodiment of this invention.

FIG. 3 is a time diagram, schematically illustration the control on the transmitting data to avoid the hand-up situation, according to one preferred embodiment of this invention. In FIG. 3, the invention provides the MMC/SD control protocol, which can be implemented into the standard MMC/SD protocol, such as the MMC 3.1 spec or SD1.1 spec, without violate the general operation in control the data transaction. For descriptions, the signals 206 and 300-312 have been involved. Here, signals, as can be understood, are used to generally refer to the status in MMC Card MMC Mode's operation, including for example the voltage state signal, control state, command, or data. The signal can be just an operation state, held by a register. In other words, the variables shown in the time diagram of FIG. 3 are generally called the signals through the whole specification and claims.

The MMC/SD has its acceptable range of the working voltage. For a flash-based MMC/SD system, the preferred working voltage is 3.3 V or 1.8V with an acceptable voltage range. However, the working voltage may have fluctuation and drop less than (or equal to) a certain critical level. In FIG. 3, the working voltage signal 300 is indicated as VCC, which is at 3.3 V.

The host state signal 206 starts from the idle state xIDLE to the receiving state xRCV. The command CMD 25 at the host write-data command signal 310 is issued during the transfer state xTRAN. Then, data at the DATA signal 312 is transferred and received to write into MMC.

However, a voltage fluctuation occurs at, for example, the xRCV state. For example, the low voltage less than or equal to 2.55 V has been detected, and the LVD signal 302 is changed from a first state to a second state, such as from a high level state (1-state) to a low level state (0-state). Then, according to the invention, an LVD interrupt signal 304, LVDint, is issued. This means that the LVDint signal 304 changes from the normal state (i.e. 0-state) to an active state (i.e. 1-state).

Then, simultaneously, the LVD interrupt signal 304 is polled to know that the LVD interrupt signal 304 still remains at the high state. This polling action can be done by using a firmware polling signal 306 to poll the LVD interrupt signal 304. As previous mention, the LVD interrupt signal 304 can be, for example, a binary state held by a register or any equivalent manner to indicate the current state. Once the LVDint signal 304 is issued, the data transaction is temporarily stop due to low voltage.

When the working voltage signal 300 returns to the acceptable range, the LVD signal 302 then returns to the original normal state as the high state. In general, when the LVD signal 302 return to the normal state, the LVD interrupt signal 304 can be reset. However, according to the MMC spec, the interrupt signal should be conditionally reset. The MMC spec requires that the LVD interrupt signal 304 is polled. Here, if the LVD interrupt signal 304 is, for example, provided by a register, then the value held in the bit register is polled. The register preferably is a bit register.

In order to comply the MMC spec, the LVD interrupt signal 304 is reset when the LVD signal 302 is high and the LVD interrupt signal 304 is still polled. Then, for example, a LVD reset signal, LVDint_Rst 308 is issued to reset the LVD interrupt signal 304. If the LVD interrupt signal 304 is, for example, provided by a register, the value held by the register is reset.

Figure 1:
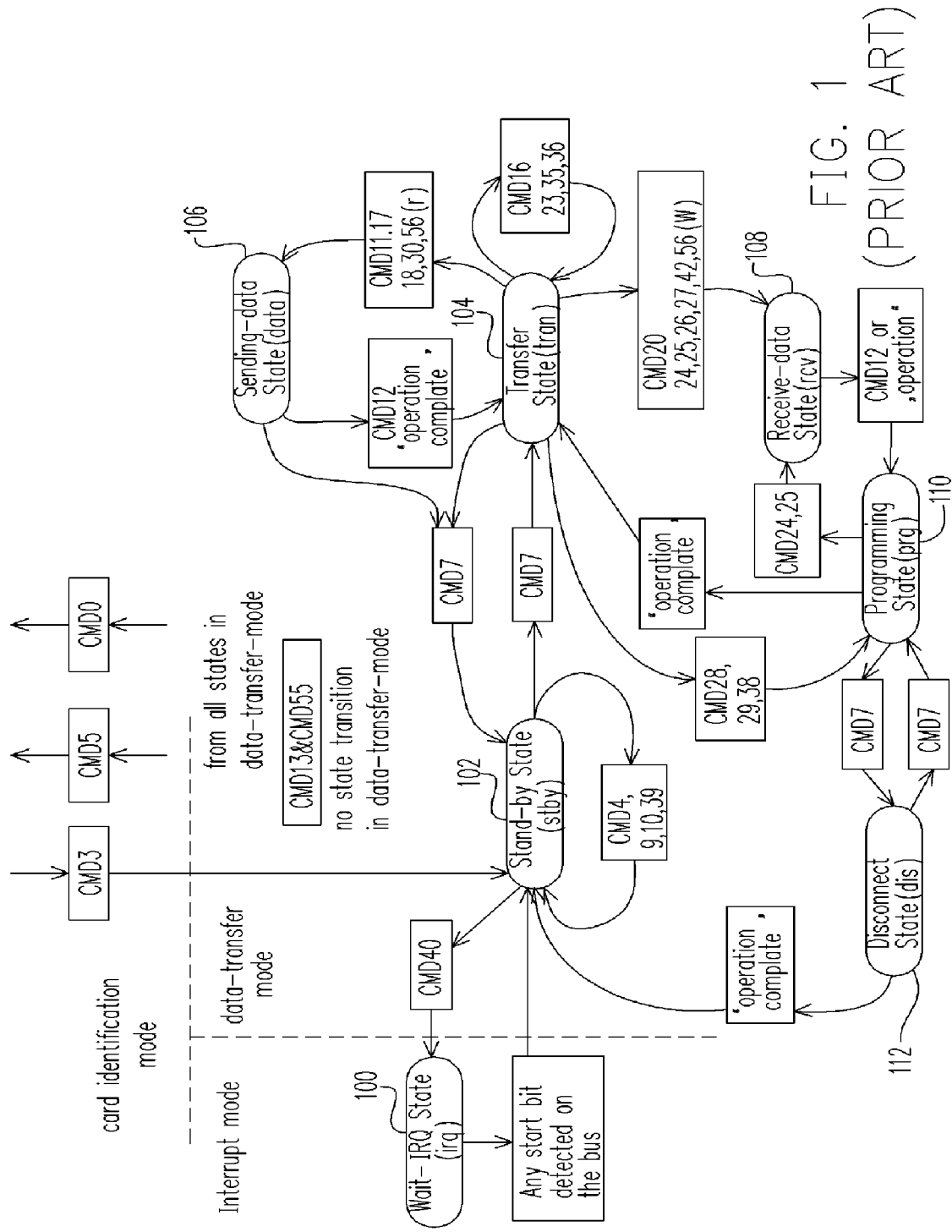
FIG. 1 is a block diagram, schematically illustrating the MMC state diagram in data transfer mode.
Figure 2:
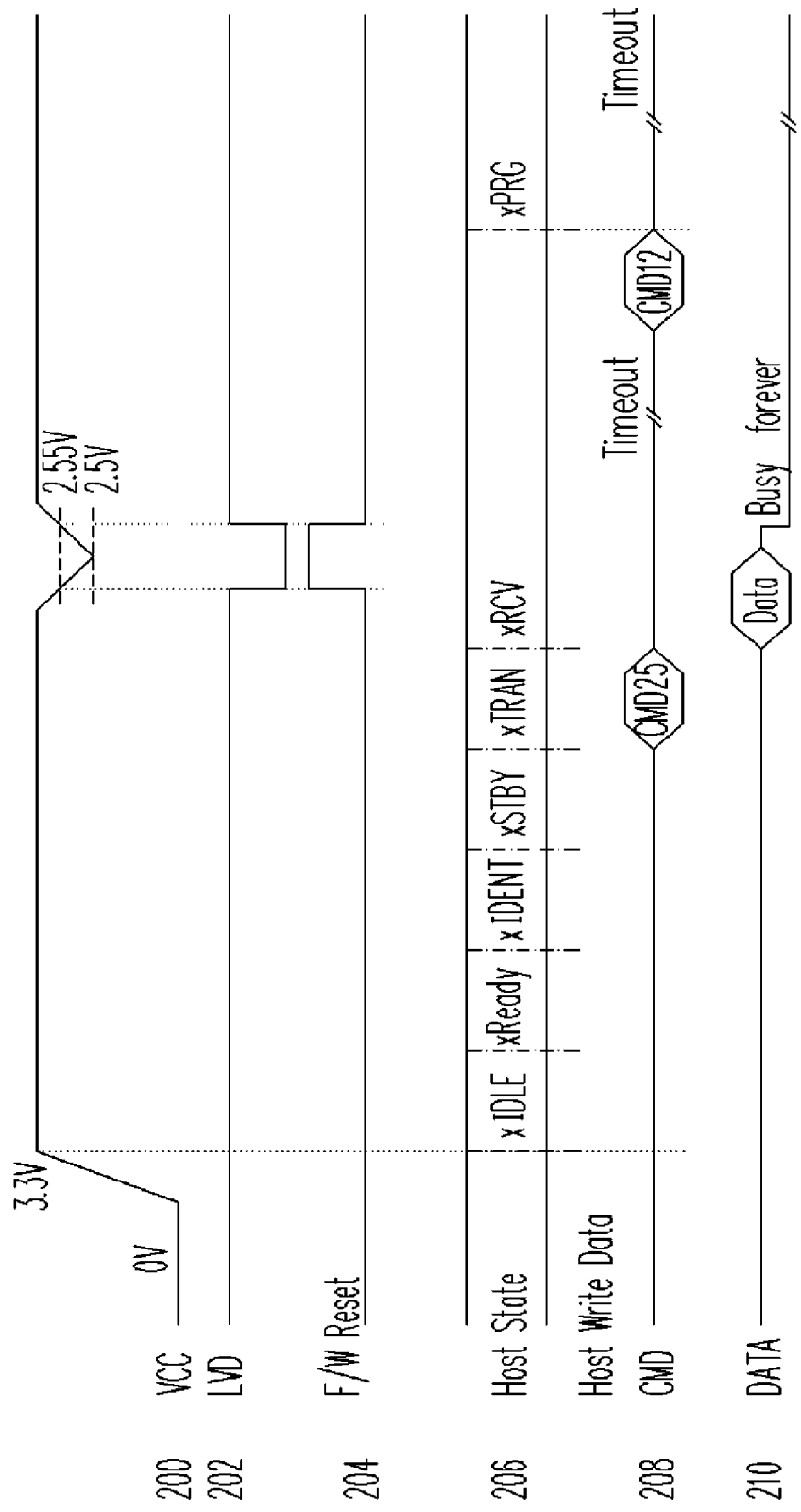
FIG. 2 is a time diagram, schematically illustration the occurrence of hand up situation in the conventional operation for transmitting data.

After the LVD interrupt signal 304 is reset, which means that the state is changed from high to low, the data transaction can be continuously performed without hand-up even if a voltage drop occurs. This is because the firmware is not reset. In conventional situation (see FIG. 2), the firmware reset signal 204 is used to reset the firmware, causing a hand-up situation.

The present invention has used the LVD interrupt signal 304 instead of the conventional firmware reset signal 204. As a result, the firmware is not reset when a low voltage occurs. The hand-up situation at the host is avoided. In order to reset the LVD interrupt signal 304, a firmware polling signal 306 is issued to poll the LVD interrupt signal 304. After the LVD signal 302 returns to the normal state, and the LVD interrupt signal has indeed been polled by the firmware polling signal 306, the LVD reset signal 308 is issued to reset the LVD interrupt signal by. For example, resetting the register that holds the state of the LVD interrupt signal 304. The modified control protocol of the invention can be implemented into the standard MMC & SD Card.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of state maintenance for a flash storage system using a plurality of signals, comprising:
    using a working voltage signal to represent a voltage level, which occasionally is less than a preset voltage level due to a voltage fluctuation;
    using a low voltage detection (LVD) signal to respond the voltage level of the working voltage signal, wherein the LVD signal is at a first state when the voltage level is greater than or equal to the preset voltage level, otherwise the LVD signal is at a second state;
    using an LVD interrupt signal to interrupt a data transferring or receiving, wherein when the LVD signal changes from the first state to the second state, the LVD interrupt signal is issued; and
    resetting the LVD interrupt signal, when the LVD signal changes from the second state to the first state, and the LVD interrupt signal is indeed polled by a firmware.

2. The method of claim 1, wherein the first state and the second state of the LVD signal are respectively a high level state and a low level state.

3. The method of claim 1, wherein the step of resetting the LVD interrupt signal comprises:
    using a firmware polling signal, to poll the LVD interrupt signal;
    checking whether or not the LVD signal has changed back to the first state; and
    issuing an LVD interrupt reset signal to reset the LVD interrupt signal, after LVD signal has changed back to the first state and the LVD interrupt signal has been indeed polled.

4. The method of claim 3, wherein the LVD interrupt signal is provided by a bit register.

5. The method of claim 4, wherein the step of checking whether or not the LVD signal has changed back to the first state is checking a held value in the bit register.

6. The method of claim 1, wherein the step of resetting the LVD interrupt signal is setting the LVD interrupt signal to a zero state.

7. The method of claim 1, wherein the voltage fluctuation occurs during a data receiving state at a host side.

8. The method of claim 1, wherein the flash storage system is based on a Secure Digital (SD) card system.

9. A flash storage card controlling protocol, wherein the controlling protocol comprises using a low voltage detection (LVD) signal to respond a voltage state of a working voltage with respect to a preset voltage level, the flash storage card controlling protocol comprising:
    using an LVD interrupt signal, which changes from a first state to a second state when the LVD signal has changed from a normal state to a low-voltage state;
    using a firmware polling signal, to poll the LVD interrupt signal when the LVD interrupt signal has changed from the first state to the second state; and
    using an LVD interrupt reset signal, which is issued after the LVD signal has changed from the low-voltage state back to the normal state and the LVD interrupt signal is indeed polled by the firmware polling signal,
    wherein the LVD interrupt reset signal resets the LVD interrupt signal.

10. The flash storage card controlling protocol of claim 9, wherein the LVD signal is at the normal state when the working voltage is greater than or equal to the preset voltage level and the LVD signal is at the low-voltage state when the working voltage is less than the preset voltage level.

11. The flash storage card controlling protocol of claim 9, wherein the LVD interrupt signal is a value held in a register.

12. The flash storage card controlling protocol of claim 11, wherein the firmware polling signal is polling the held value in the register.

13. A flash storage card controlling protocol, wherein the controlling protocol comprises using a low voltage detection (LVD) signal to respond a voltage state of a working voltage with respect to a preset voltage level, the flash storage card controlling protocol comprising:
    using an LVD interrupt signal, which changes from a first state to a second state when the LVD signal has changed from a normal state to a low-voltage state; and
    using an LVD interrupt reset signal, which is issued after the LVD signal has changed from the low-voltage state back to the normal state,
    wherein the LVD interrupt reset signal resets the LVD interrupt signal.

14. The flash storage card controlling protocol of claim 13, wherein the LVD interrupt reset signal further requests that the LVD interrupt signal is also polled before being issued.

* * * * *